(12) United States Patent
Pei

(10) Patent No.: US 8,402,912 B2
(45) Date of Patent: Mar. 26, 2013

(54) SPIN COATING DEVICE

(75) Inventor: Shao-Kai Pei, Taipei Hsien (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 265 days.

(21) Appl. No.: 12/888,423

(22) Filed: Sep. 23, 2010

(65) Prior Publication Data

US 2011/0253038 A1 Oct. 20, 2011

(30) Foreign Application Priority Data

Apr. 19, 2010 (CN) .......................... 2010 1 0150151

(51) Int. Cl.
*B05B 3/00* (2006.01)
*B05B 3/10* (2006.01)
*B05B 7/06* (2006.01)
*B05C 5/00* (2006.01)
*B05C 3/00* (2006.01)
*B01F 15/00* (2006.01)

(52) U.S. Cl. ........ 118/323; 118/428; 118/429; 118/304; 118/313; 118/315; 239/223; 366/169.1

(58) Field of Classification Search .................. 118/52, 118/56, 612, 410, 428, 429, 323, 13, 19, 118/29, 304, 313–315, 427; 134/153, 198, 134/902; 427/240, 430.1; 366/168.1, 169.1, 366/170.3, 263, 147, 307; 239/222–224
See application file for complete search history.

(56) References Cited

U.S. PATENT DOCUMENTS 3,773,302 A * 11/1973 Johnson et al. ............ 366/164.6
2002/0101782 A1 * 8/2002 Hasberg et al. ............ 366/169.1

FOREIGN PATENT DOCUMENTS

DE 102004048568 A1 * 4/2006

* cited by examiner

*Primary Examiner* — Yewebdar Tadesse
(74) *Attorney, Agent, or Firm* — Altis Law Group, Inc.

(57) ABSTRACT

A spin coating device includes a container and a rotating member. The container is used for holding a first solution and includes a sidewall which a plurality of substrates are arranged on. The rotating member is rotatable within the container and includes an inlet and at least one outlet. A second solution flows into the rotating member through the inlet, and flows into the container through the at lease one outlet. A mixture of the first solution and the second solution is spread onto the substrate by centrifugal force of the rotating member.

8 Claims, 3 Drawing Sheets

SPIN COATING DEVICE

BACKGROUND

1. Technical Field

The present disclosure relates to coating devices, particularly, to a spin coating device.

2. Description of Related Art

Spin coating is a procedure used to apply uniform thin films to flat substrates. In short, an excess amount of a solution is placed on the substrate, which is then rotated at high speed in order to spread the fluid by centrifugal force. Although conventional spin coating devices satisfy basic requirements, a new spin coating device is still needed.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION

Embodiments of the present disclosure will now be described in detail below, with reference to the accompanying drawings.

Figure 1:
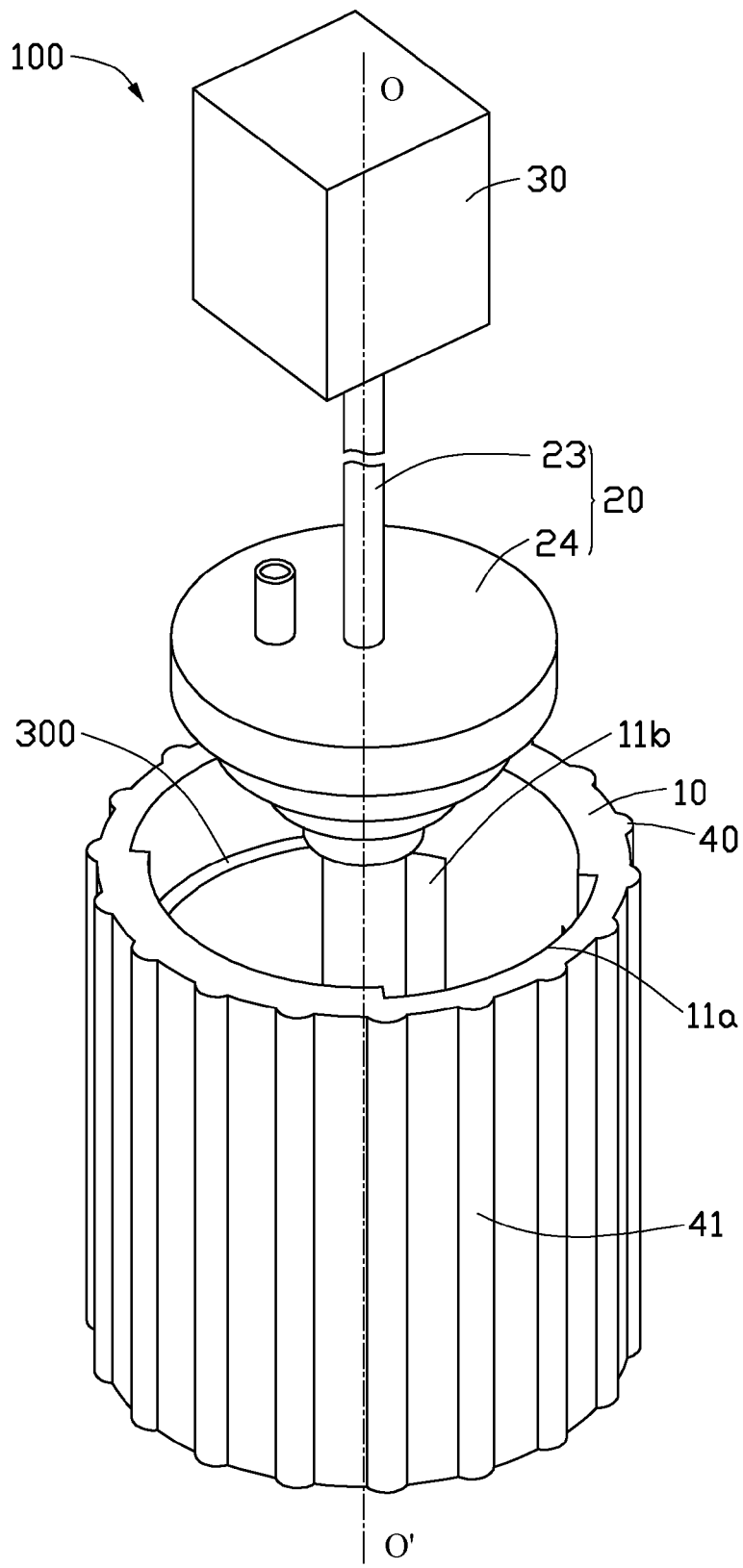
FIG. 1 is a schematic, exploded view of a spin coating device in accordance with one embodiment.
Figure 2:
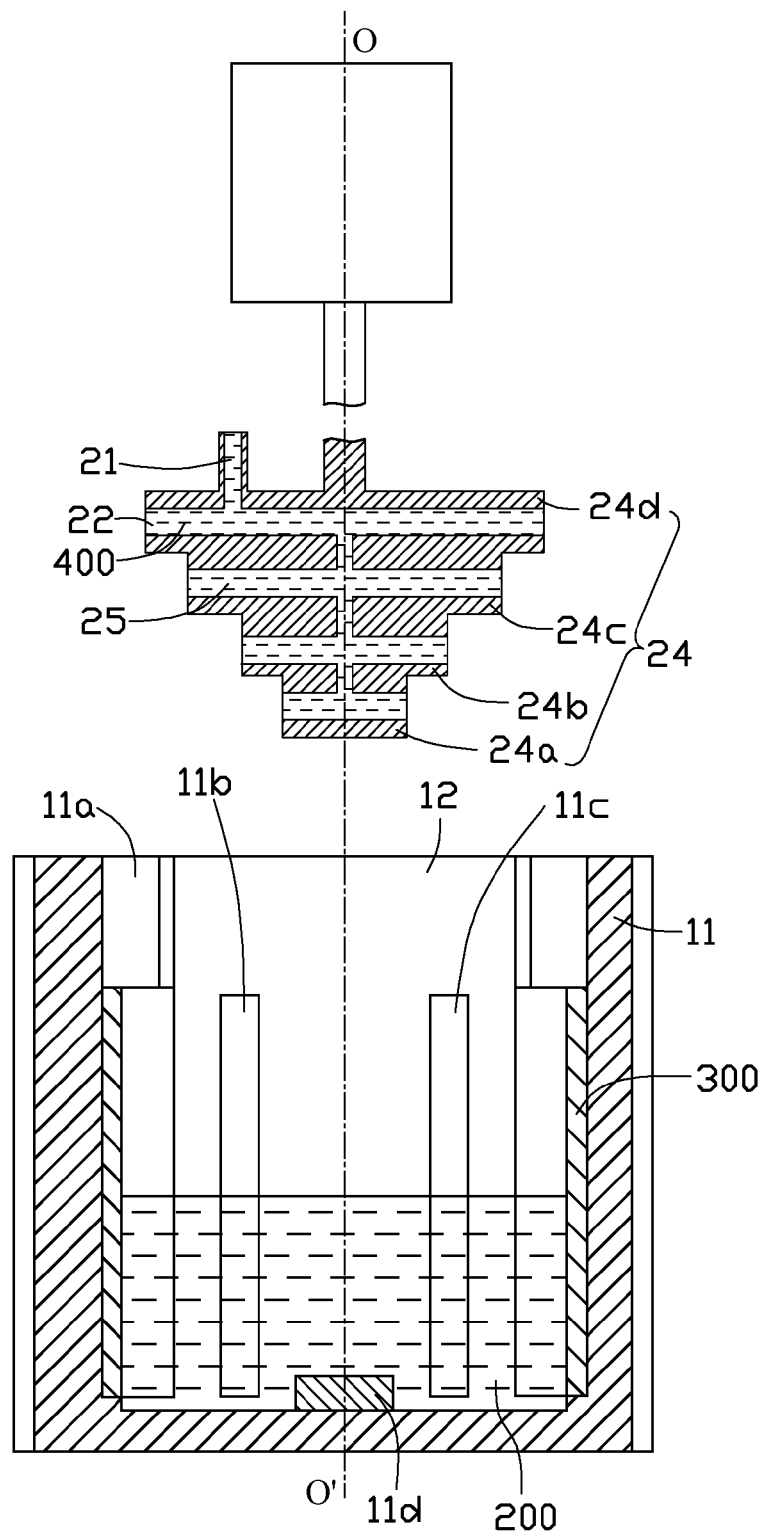
FIG. 2 is a schematic cross-sectional view of the spin coating device of FIG. 1.
Figure 3:
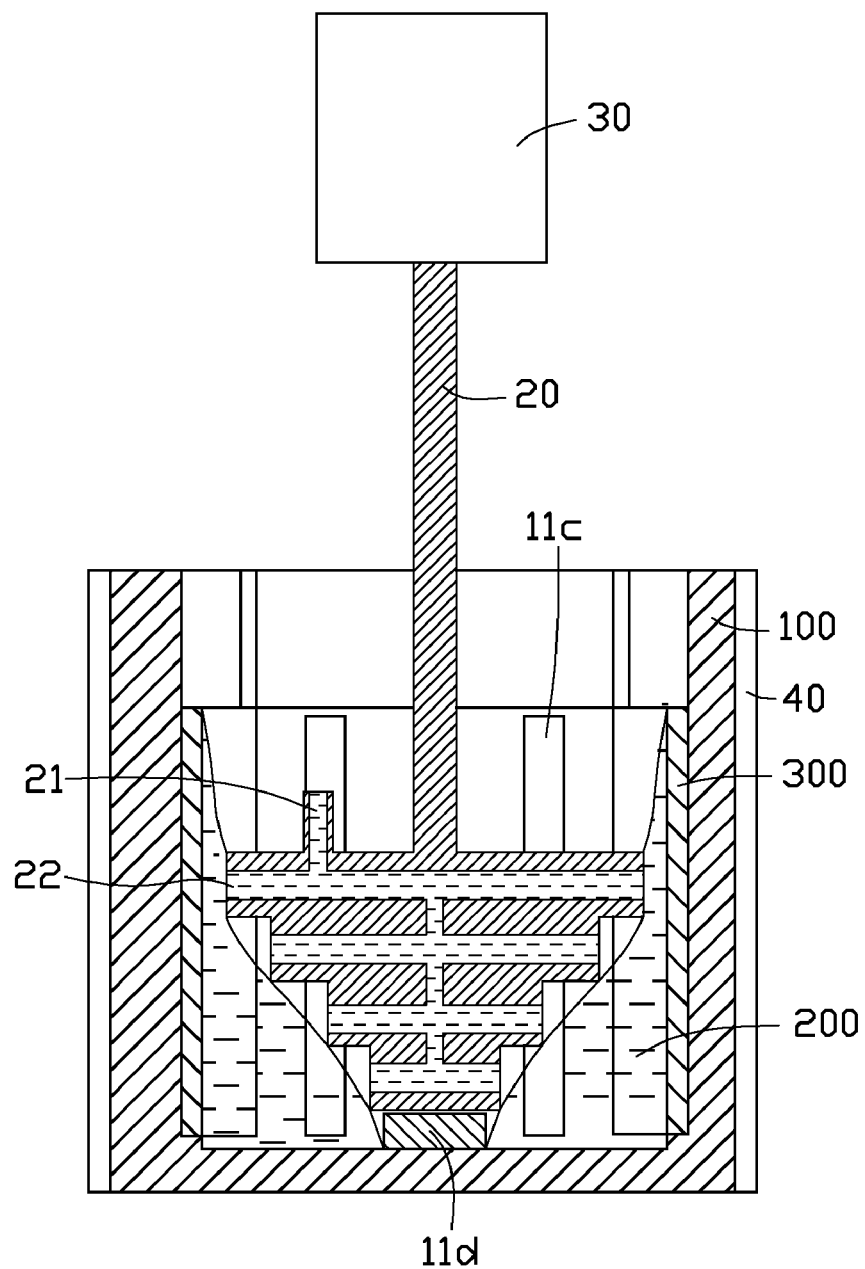
FIG. 3 is a schematic cross-sectional view of the spin coating device of FIG. 1, showing solution spread on a number of substrates.

Referring to FIGS. 1-3, a spin coating device 100 is provided for spreading solution onto a number of substrates 300. The spin coating device 100 includes a container 10, a rotating member 20, and a driving member 30. The container 10 holds a first solution 200 and includes an open end 12 and a lateral wall 11, on which a number of substrates 300 are arranged. In the embodiment, the lateral wall 11 defines a number of recessed portions 11a. Each substrate 300 is arranged in one recessed portion 11a.

The container 10 also includes an inlet 11b and an outlet 11c, which allows the solution 200 to flow into and out of the container 10. In the embodiment, the inlet 11b and the outlet 11c extend along a longitudinal direction of the container 10. The inlet 11b may be coupled to a valve (not shown) that can be controlled to open and close to allow the solution 200 to flow through the inlet 11b. The configuration of the inlet 11b may be varied according to need. The outlet 11c may also be coupled to a valve (not shown).

The rotating member 20 can be driven by the driving member 30 to move into and rotate within the container 10. The rotating member 20 includes a shaft 23 and a spinning member 24. One end of the shaft 23 is coupled to the driving member 30, and an opposite end is coupled to the spinning member 24. In the embodiment, the spinning member 24 includes four cylindrical members 24a, 24b, 24c, and 24d that are stacked on each other. The four cylindrical members 24a, 24b, 24c, and 24d gradually increase in diameter, all of which are less than the inner diameter of the open end 12.

An inlet 21 is defined in an upper end of the spinning member 24. A number of outlets 22 are respectively defined in the lateral surface of each of the cylindrical members 24a, 24b, 24c, and 24d. A number of channels 25 are defined in the spinning member 24. The channels 25 communicate with each other and the outlets 22 communicate with each other through the channels 25. A second solution 400 can thus flow into the spinning member 24 through the inlet 21, and flow into the container 10 through the outlets 22. A thin film of the mixture of the first solution 200 and the second solution 400 can then be spread onto the substrate 300 by centrifugal force created by spinning of the spinning member 24.

After that, the substrates 300 can be taken out of the container 10 and typically placed quickly onto a hot plate (heated to somewhere around 100° C.) for several seconds or minutes to initially evaporate solvent and solidify the coating. The substrates 300 are then baked-out for several hours, or typically over night, in an oven or vacuum oven, at a temperature high enough to sufficiently remove the remaining solvent. A thin film of coating is ultimately applied on each substrate 300.

In the embodiment, the spin coating device 100 further includes a heater 40 to at least implement the initial evaporating and solidifying process described above. The heater 40 includes a number of heating bars 41. The heating bars 41 can be evenly arranged on the exterior of the lateral wall 11 of the container 10. Once a film of the mixture of the first solution 200 and the second solution 400 is spread on the substrates 300, the heater 40 can be activated to heat the lateral wall 11 and to further heat the substrates 300.

After the mixture of the first solution 200 and the second solution 400 is spread on the substrates 300, the mixture can be discharged from the outlet 11c of the container 10. In the embodiment, a heating unit 11d is arranged on the bottom of the container 10 to heat the bottom to evaporate mixture remaining on the bottom.

While various embodiments have been described and illustrated, the disclosure is not to be constructed as being limited thereto. Various modifications can be made to the embodiments by those skilled in the art without departing from the true spirit and scope of the disclosure as defined by the appended claims.

What is claimed is:

1. A spin coating device comprising:
   a container for holding a first solution and comprising a sidewall which a plurality of substrates are to be arranged on; and
   a rotating member rotatable within the container and comprising four cylindrical members stacked on each other, each cylindrical member defining a first outlet in a lateral surface thereof, the first outlets of the four cylindrical members being in communication with each other, one of the cylindrical member defines a first inlet that is in communication with the first outlets thereof;
   wherein a second solution flows into the rotating member through the first inlet, and flows into the container through the first outlets of the four cylindrical members, a mixture of the first solution and the second solution is spread onto the plurality of substrates by centrifugal force of the rotating member.

2. The spin coating device according to claim 1, wherein the rotating member comprises a lateral surface, the at least one first outlet is defined in the lateral surface.

3. The spin coating device according to claim 1, wherein the container comprises a second inlet and a second outlet.

4. The spin coating device according to claim 3, wherein the second outlet is defined in the sidewall of the container.

5. The spin coating device according to claim 1, further comprising a heater for heating the plurality of substrates.

6. The spin coating device according to claim 5, wherein the heater is arranged on the sidewall of the container.

7. The spin coating device according to claim 6, wherein the heater comprises a plurality of heating bars.

8. The spin coating device according to claim 1, further comprising a heating unit to heat a bottom of the container.

* * * * *